(12) United States Patent
Holzmann et al.

(10) Patent No.: US 11,309,668 B2
(45) Date of Patent: Apr. 19, 2022

(54) WIDEBAND COUPLER

(71) Applicant: Rohde & Schwarz GmbH & Co. KG, Munich (DE)

(72) Inventors: Gottfried Holzmann, Zorneding (DE); Waldemar Henrich, Neubiberg (DE); Martin Oetjen, Groebenzell (DE); Matthias Jelen, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 89 days.

(21) Appl. No.: 16/670,713

(22) Filed: Oct. 31, 2019

(65) Prior Publication Data
US 2021/0066865 A1 Mar. 4, 2021

(30) Foreign Application Priority Data
Aug. 30, 2019 (EP) .................................... 19194528

(51) Int. Cl.
*H01R 13/7193* (2011.01)
*H01R 13/66* (2006.01)
*G01R 1/20* (2006.01)

(52) U.S. Cl.
CPC ..... *H01R 13/7193* (2013.01); *H01R 13/6616* (2013.01); *G01R 1/20* (2013.01)

(58) Field of Classification Search
CPC .......... H01P 5/183; H01P 1/2007; H01P 5/04; H01P 5/18; H01P 5/12; H01P 1/205; H01P 1/23; H01P 3/00; H01P 5/02; H01P 5/085; H01P 5/103; H01P 5/107; H01P 5/184; H01P 5/20; G01R 15/06; G01R 19/0092; G01R 21/00; G01R 27/08; G01R 27/14; G02F 1/3132; H01Q 19/10; H01Q 1/38; H01Q 7/00; H01Q 9/16; H01Q 9/27; H01R 2103/00; H01R 12/515; H01R 24/40;
(Continued)

(56) References Cited

U.S. PATENT DOCUMENTS 4,859,971 A * 8/1989 Edwards ................. H01P 5/183
333/109
5,132,646 A * 7/1992 Faxon ....................... H01P 5/20
333/121
(Continued)

FOREIGN PATENT DOCUMENTS

DE    35 40 479 A1    6/1986
EP    0 855 794 A2    7/1998
(Continued)

OTHER PUBLICATIONS

"2-Way Coaxial Splitter, 100-2700M Frequency RF Power Splitter Divider Combiner for Industrial Equipment Electrical", https://www.amazon.com/gp/product/B07QPZSSGF/ref=ox_sc_act_title_1?smid=A2TMCEJ2C8SAEN&psc=1, Date First Available—Apr. 17, 2019 (Year: 2019).*

*Primary Examiner* — Edwin A. Leon
*Assistant Examiner* — Matthew T Dzierzynski
(74) *Attorney, Agent, or Firm* — Ditthavong, Steiner & Mlotkowski

(57) ABSTRACT

A coupler, in particular a resistive coupler, wherein all ports are at least partially or completely arranged in or at a connector. The coupler comprises resistors which are adapted to sum and/or divide the incoming and/or outgoing signal. The resistors are arranged at or in the connector. A sum port and/or at least two dividing ports are arranged on a substrate.

13 Claims, 6 Drawing Sheets

(58) Field of Classification Search
CPC ...... H01R 24/44; H01R 24/50; H01R 24/547; H01R 9/05; H01R 9/0515; H03H 7/48; H03H 7/38; H03H 7/42
See application file for complete search history.

(56) References Cited

U.S. PATENT DOCUMENTS

| | | | | |
|---|---|---|---|---|
| 5,926,076 | A * | 7/1999 | Johnson | H01P 5/183 333/109 |
| 6,066,994 | A * | 5/2000 | Shepherd | H01P 5/18 333/109 |
| 6,362,709 | B1 | 3/2002 | Paxman et al. | |
| 6,784,521 | B2 * | 8/2004 | Setty | H03H 7/48 257/662 |
| 7,026,888 | B2 * | 4/2006 | Antkowiak | H01P 5/183 333/121 |
| 7,183,876 | B2 * | 2/2007 | Fallon | H01P 5/04 333/109 |
| 7,234,948 | B2 * | 6/2007 | Kim | H01P 5/183 439/76.1 |
| 7,429,903 | B2 * | 9/2008 | Antkowiak | H01P 5/183 333/109 |
| 8,120,444 | B2 * | 2/2012 | Haunberger | H01P 5/12 333/132 |
| 8,294,530 | B2 * | 10/2012 | Van Swearingen | H01P 1/2007 333/24 R |
| 9,105,954 | B2 * | 8/2015 | Morgenstern | H01P 5/183 |
| 9,300,026 | B2 * | 3/2016 | Haunberger | H01P 5/12 |
| 9,490,520 | B2 * | 11/2016 | Morgenstern | H01P 5/183 |
| 9,698,463 | B2 * | 7/2017 | Wild | H01P 5/04 |
| 10,476,124 | B2 * | 11/2019 | Holt | H01P 3/00 |
| 2005/0264374 | A1 * | 12/2005 | Podell | G01R 15/06 333/109 |
| 2011/0241804 | A1 | 10/2011 | Kato et al. | |
| 2020/0287265 | A1 * | 9/2020 | Wu | H01P 5/18 |

FOREIGN PATENT DOCUMENTS

| | | |
|---|---|---|
| WO | 2011076328 A1 | 6/2011 |
| WO | 2010071027 A1 | 5/2012 |
| WO | 2013149930 A1 | 10/2013 |

* cited by examiner

WIDEBAND COUPLER

PRIORITY

This application claims priority of European patent application EP 19 194 528.6 filed on Aug. 30, 2019, which is incorporated by reference herewith.

FIELD OF THE INVENTION

This invention relates to a wideband coupler, especially a wideband-jack-ferrite-coupler, applicable in a test-setup.

BACKGROUND OF THE INVENTION

Wideband-ferrite-couplers are used for a separation and/or combining of transmit signals and receive signals in measurement systems. There is a growing need for the measurement systems, using wideband-ferrite-couplers. The test-systems are used for performing tests on handheld mobile devices using radio communications. Various radio standards are implemented in modern communication-devices. Each of the radio standards may differ in its transmission-frequency, bandwidth, power and duplex modes. Therefore, the signal-separation and signal-combination of a coupler must have a broadband functionality, so that all the radio standards can be applied to the respective frequency bands of transmit and receive signals.

This separation of transmit and receive signals is necessary for measurements of the communications device with two or more individual modules, at least a transmitting and a receiving module. Since the send and receive operations in the mobile networks run at the same time, it must be ensured that the signals of the transmitter section of the measurement system are only passed to the device under test (DUT) and do not reach the receiving module of the DUT. The receiver section of the measurement system can otherwise be degraded in its sensitivity against the DUT signals.

For example, the document WO 2013/149930 A1 shows a Broadband directional coupler for measuring an advancing or a returning radio-frequency signal. The directional coupler comprises a rotationally symmetric housing separated in sections and an inner conductor. The housing sections includes milled grooves to receive resistors for realizing the coupling circuit.

The state of the art is disadvantageous since it requires a highly complex housing. Furthermore, the integration of the state of the art solution into a measuring-device is challenging.

Accordingly, there is a need to provide a coupler for a separation and/or combining of transmit signals and receive signals, which has a wideband-capability without requiring a complex assembly of the coupler.

SUMMARY OF THE INVENTION

According to one aspect of the invention, the coupler is designed in particular as a resistive coupler. All ports of the coupler are partially or completely arranged at a connector. Alternatively, these ports are partially or completely arranged in the connector. The coupler includes resistors, which are adapted to sum and/or divide the incoming and/or outgoing signal. The resistors are arranged at or in the connector. A sum port and/or at least two dividing ports are arranged on a substrate. This results in a coupler, which is easily integratable in a hardware of a measurement device. Furthermore, the installation of the coupler in a fully automated manufacturing process is enabled.

Advantageously and preferably, the resistors of the coupler are ceramic resistors. At least two resistors may comprise a common ceramic substrate. This allows for a very low complexity of the assembly of the coupler.

Further advantageously and preferably, at least one of the resistors comprises a thin-film resistive element. This results in an enhanced wideband capability of the coupler.

Advantageously and preferably, the connector of the coupler is a coaxial connector comprising a shell, a central conductor and a dielectric material. The dielectric material is configured to separate the shell from the central conductor. This allows for the use of the coupler in a front-end in a measurement device as such a coaxial connector can directly be used as an measurement port connector.

Alternatively, the shell is divided in a length direction to an isolated shell section and a shell section connected to a body of the connector whereby performing a divider section. The interruption of the shell allows an access to the central conductor of the connector.

Advantageously and preferably, at least one part of the shell is connected to ground and the other part is connected to the substrate. This allows the attachment of the sum port in the connector.

Advantageously and preferably, the common ceramic substrate carrying the at least two resistors is arranged within the divided section of the shell. This enhances the termination certainty of the resistors.

Advantageously and preferably, the shell of the connector is fixed to a reference-signal plane of the substrate, and/or a body of the connector and the shell connected to the body of the connector are fixed to a reference-signal plane of the substrate. This enhances the termination certainty of the connector.

Advantageously and preferably, the central conductor of the connector is connected to one of the dividing ports on the substrate. This allows for further accessibility of the incoming and/or outgoing signals.

Advantageously and preferably, the common ceramic substrate carrying the at least two resistors is penetrated by the central conductor of the connector.

Advantageously and preferably, at least one of the resistive elements is arranged circularly with respect to the central conductor of the connector and/or at least one of the resistive elements is formed as at least one segment of a circle with respect to the central conductor. This results in short connection traces, which increases the termination quality of the coupler and thereby increases measuring quality.

Advantageously and preferably, the conductor is connectable to an additional means, and/or the connector is placed in a recess area of the substrate. This leads to a direct contacting between the connector terminals and the conductors of the substrate and therefore the reduction of signal reflexions.

Advantageously and preferably, at least one ferrite-bead is arranged on or around the connector. This further increases the separation between the signals leading to an enhancement of the quality of measurements.

Advantageously and preferably, the substrate comprises a recess area configured to receive at least one of the at least one ferrite-beads and/or the connector comprises a circular slot adapted to integrate at least one of the at least one ferrite-beads. This assures a simplification of manufacturing of the coupler.

Advantageously and preferably, the at least one ferrite-beads is penetrated by the central conductor of the connector and by the shell conductor of the connector. This enhances the influence of the ferrite beads to the frequency response, as well as the manufacturability.

BRIEF DESCRIPTION OF THE DRAWINGS

An exemplary embodiment of the invention is now further explained with respect to the drawings by way of example only, in which.

DETAILED DESCRIPTION OF PREFERRED EMBODIMENTS

First, we show a first exemplary embodiment of the inventive wideband-jack-ferrite-coupler with regard to FIG. 1-FIG. 5. Along FIG. 6-FIG. 10, the construction of a second exemplary embodiment of the inventive wideband-jack-ferrite-coupler is shown. Finally, with regard to FIG. 11 and FIG. 12, a detail of the inventive wideband-jack-ferrite-coupler is described. Similar entities and reference numbers in different figures have been partially omitted.

Figure 1:
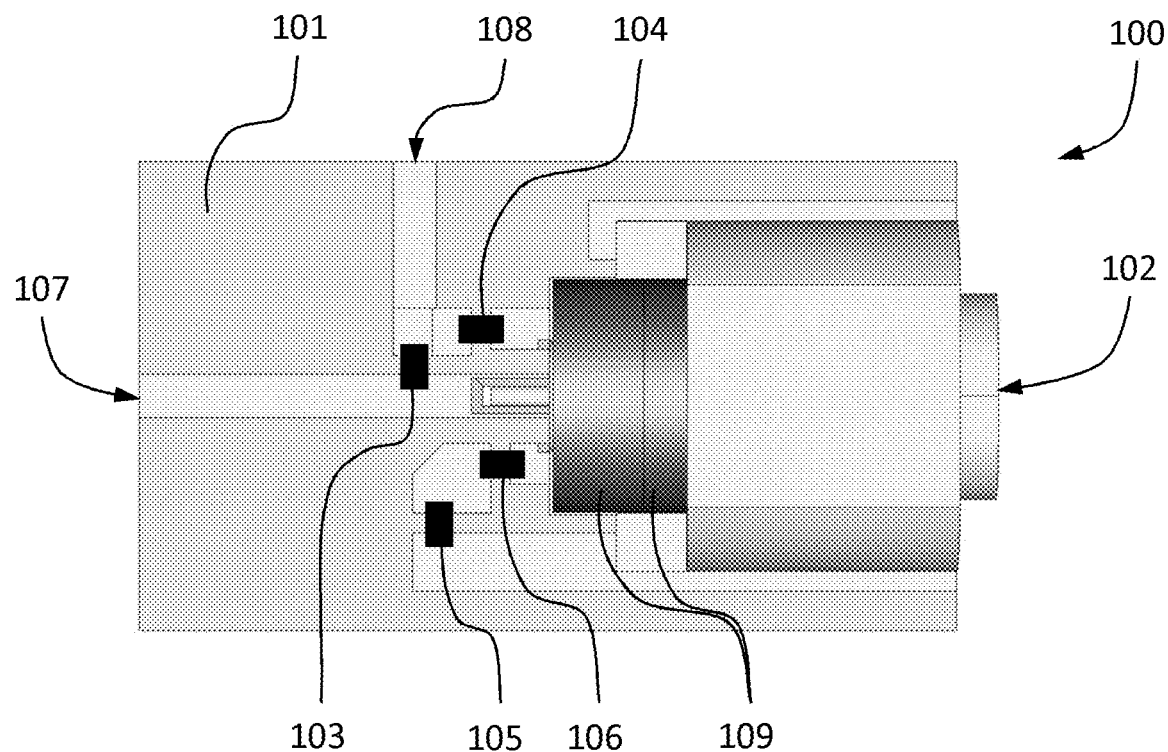
FIG. 1 shows top view a first exemplary embodiment of the inventive wideband-jack-ferrite-coupler.

In FIG. 1, a first exemplary embodiment of the inventive wideband-jack-ferrite-coupler 100 is shown. The exemplarily wideband-jack-ferrite-coupler 100 comprises a substrate 101, a connector 102, ferrite beads 109 and resistors 103, 104, 105, 106.

The substrate 101 carries all components of the exemplary wideband-jack-ferrite-coupler 100. The substrate is preferably made of a material suitable for radio frequency applications. In particular, the substrate 101 has preferably a small dissipation factor in RF applications. There is a variety of materials available. A glass filled PTFE is a suitable material as a substrate. If the requirements on behalf of frequency are not that high, a high performance FR4 material is usable. For highest performance applications special RF materials, e.g. ROGER RO3003, are available.

Additionally the substrate 101 comprises the wiring structure and the sum port 107 and/or two dividing ports 102, 108 on the top side of the substrate 101. The ports 102, 107,108 arranged at the connector 110 and are guided to the edge of the substrate 101. The ports 107, 108 at the edge of the substrate 101 represent the electrical interface to a measuring device. The bottom side (not shown in FIG. 1) of the substrate 101 comprises a conductive layer which is connected to a reference signal plane. Such a reference signal plane can have ground potential. Therefore, the wideband-jack-ferrite-coupler 100 is constructed to be placed on a prepared area of a printed circuit board of the measuring device.

The connector 110 in the exemplary wideband-jack-ferrite-coupler 100 is an edge mounted coaxial connector. This connector 110 can be e.g. MMCX, SMA, SMB, SMC, BNC, TNC or N connectors. The invention is not limited to the listed connector types. The connector 110 further comprises the ferrite-beads 109. This configuration will be lined out in a following section concerning FIG. 2.

The resistors 103, 104, 105, 106 are placed on the side of the substrate 101 comprising the wiring structure. Preferably, the resistors 103, 104, 105, 106 are configured as a Wheatstone-bridge. A first resistor 103 is connected with its first connection to the dividing port 102 and to the sum port 107. The second connection of the first resistor 103 is connected to a first connection of the second resistor 104 and the second dividing port 108. This forms a first branch of the Wheatstone-bridge. The second branch of the Wheatstone-bridge is formed by a third resistor 105 and a fourth resistor 106 in series configuration in combination with the impedance of a device connected to the sum port 107. The first connection of the third resistor 105 is connected to the reference signal plane. The second connection of the third resistor 105 is connected to a first connection of the fourth resistor 106 and the shell of the connector 112. The ferrite-beads 109 placed on the shell of the connector 112 form a balun for transforming the asymmetrical signal of the dividing port 102 into a symmetrical signal usable for the bridge.

The resistors 103, 104, 105, 106 are ceramic-chip-resistor. In high precision applications for RF-measurements these resistors 103, 104, 105, 106 have a thin film resistive element. Thin-film resistive elements are characterized by a low noise, a low temperature dependency and low resistance tolerance. Alternatively, thick-film resistive elements can be used for cost sensitive applications. Thick-film resistors have good performance characteristics which are suitable for many measurement applications.

Besides using ceramic-chip-resistors, a direct application of the resistive element on the substrate 101 can be used. The direct applied resistive elements is able to further enhance the termination quality of the wideband-jack-ferrite-coupler.

A bridge arrangement as described above has a good decoupling characteristics for both of the dividing ports 102, 108. Additionally, the attenuation between the sum port 107 and one of the dividing ports 102, 108 preferably is about 6 dB.

Figure 2:
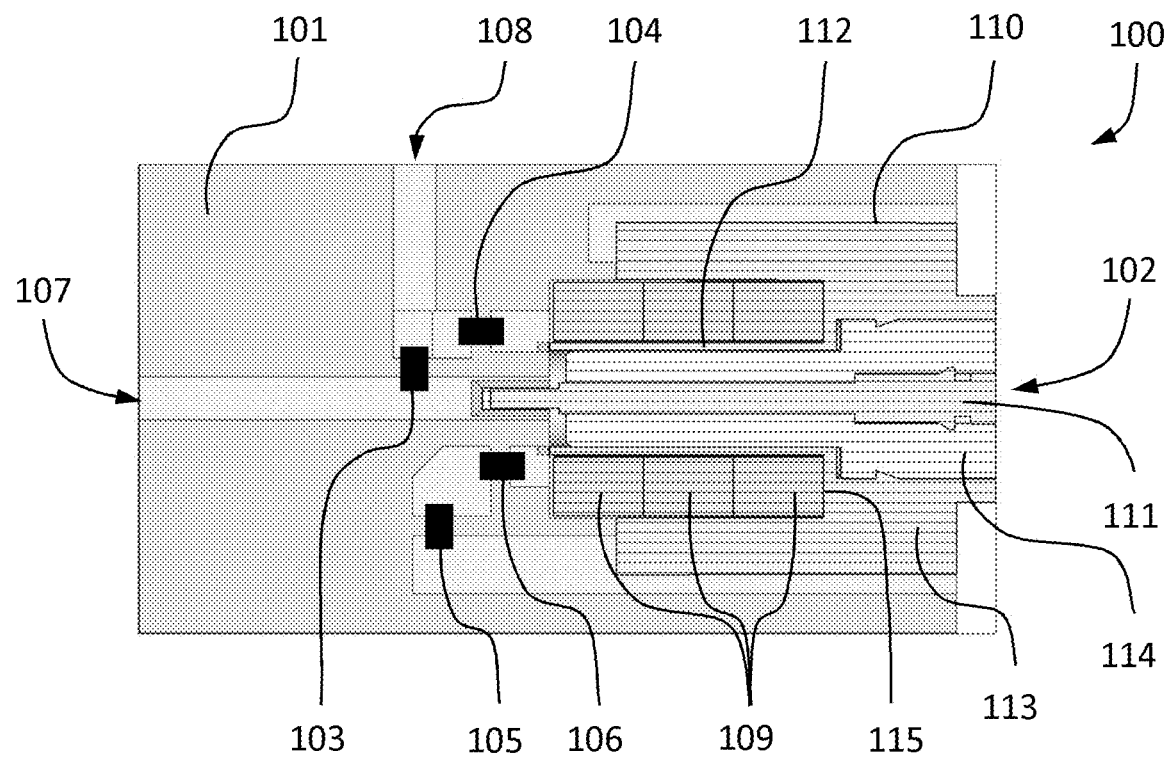
FIG. 2 shows a sectional top view of the first exemplary embodiment of the inventive wideband-jack-ferrite-coupler.

FIG. 2 shows a sectional top view of the first exemplary embodiment of the inventive wideband-jack-ferrite-coupler 100. The sectional view in particular makes the construction of the connector 110 in combination with the ferrite-beads 109 visible. The connector 110 comprises a body 113. The body 113 has a circular slot 115. The circular slot 115 is dimensioned in a way that the ferrite-beads 109 can be integrated into the connector 110. It is noted that a shell 112 is formed at the inner side of the circular slot 115. A central conductor 111 penetrates die centrum of the connector 110. This central conductor 111 is separated from the shell 112 as well as from the body 113 by an insulator 114. This insulator 114 is dimensioned so that the connector 110 comprises a good impedance matching.

The ferrite-beads 109 are fixed in the slot of the connector 110 preferably by using an adhesive. The adhesive can be a resin, an epoxy resin, a cyan-acrylate adhesive or any adhesive with suitable electrical characteristics. Beside this, the ferrite-beads 109 can be formed directly into the slot of the connector 110 using the sintering process of ferrite production.

Figure 3:
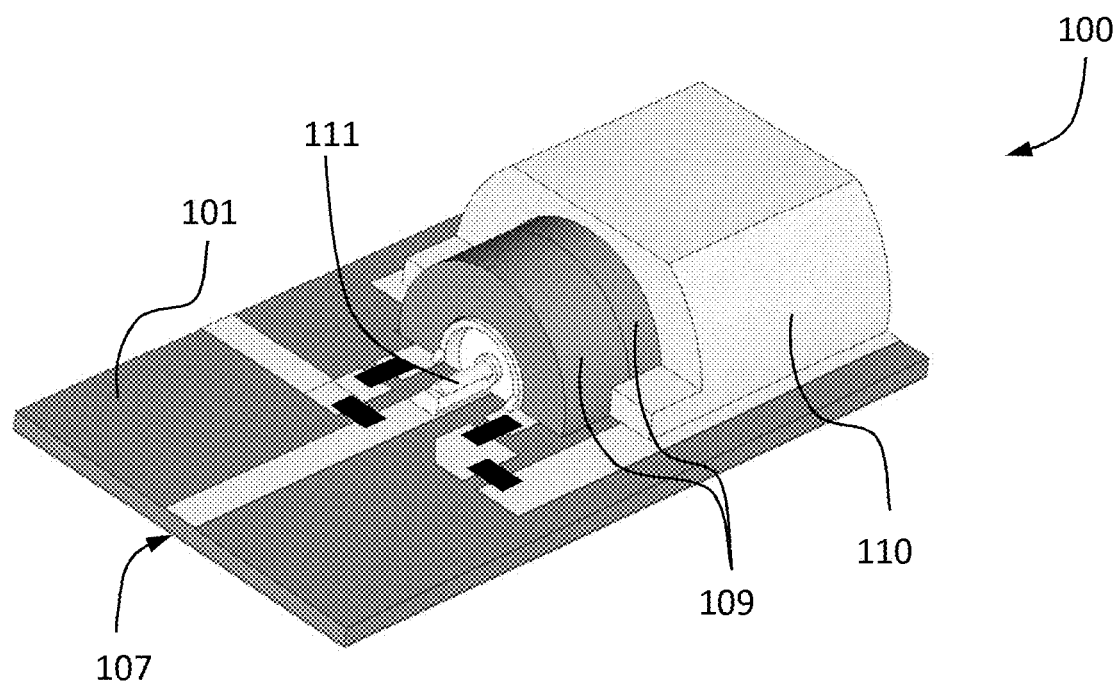
FIG. 3 shows a perspective view of the first exemplary embodiment of the inventive wideband-jack-ferrite-coupler.

The perspective view of the first exemplary embodiment of the inventive wideband-jack-ferrite-coupler 100 is shown in FIG. 3. The perspective view shows the integration of the connector 110 into the substrate 101. The connector 110 is placed in a recess area of the substrate 101. Further, it can be seen that the ferrite-beads 109 are also integrated into the substrate 101. Additionally, the ferrite-beads 109 are placed in a circular slot of the connector 110. The central conductor 111 is attached to the sum port 107.

Figure 4:
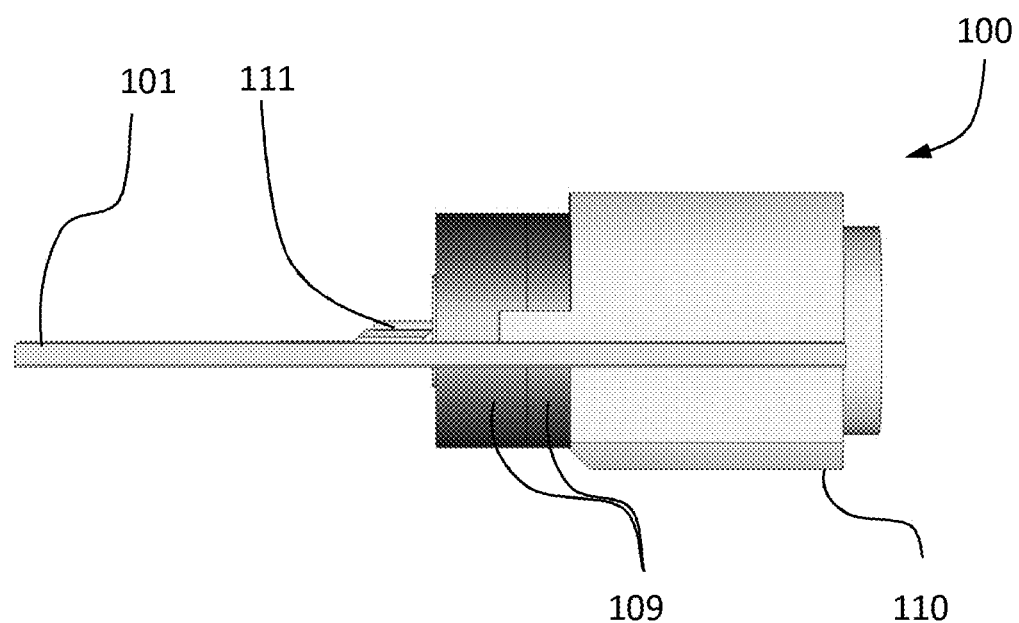
FIG. 4 shows side view of the first exemplary embodiment of the inventive wideband-jack-ferrite-coupler.

FIG. 4 shows a side view of the wideband-jack-ferrite-coupler 100. Here it can be seen in more detail, that the connector 110 include the ferrite-beads 109 whereby penetrating the substrate 101. The central conductor 111 is connected to the dividing structure of the substrate 101 at the top side. The flat connection of the central conductor 111 reduces the reflection on the connection point. Advantageously, the bandwidth of the coupler is increased.

Figure 5:
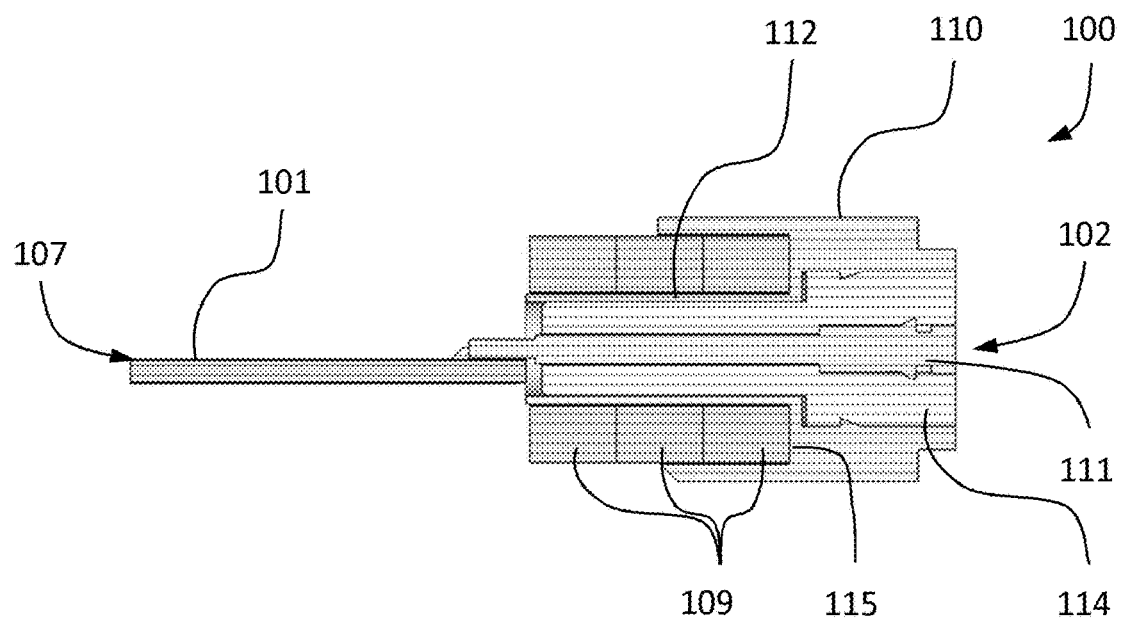
FIG. 5 shows a sectional side view of the first exemplary embodiment of the inventive wideband-jack-ferrite-coupler.

FIG. 5 shows are sectional side view of the wideband-jack-ferrite-coupler 100. In this view it more obvious how the connector 110 is integrated into the substrate 101. The central conductor 111 reaches from the dividing port 102 to the sum port 107. The shell 112, the dielectric material 114 and the central conductor 111 are assembled as a coaxial line. The ferrite-beads 109 are fixed on this coaxial line. This configuration leads to a balun circuit. This balun is responsible for a conversion of a symmetrical signal into a unsymmetrical signal and of a unsymmetrical signal into a symmetrical signal. This is an essential part in a measuring bridge for the wideband-jack-ferrite-coupler 100. One of the dividing ports, here dividing ports 102, is not related to a reference potential. Therefore, it has to be converted into a signal free of reference potential.

Figure 6:
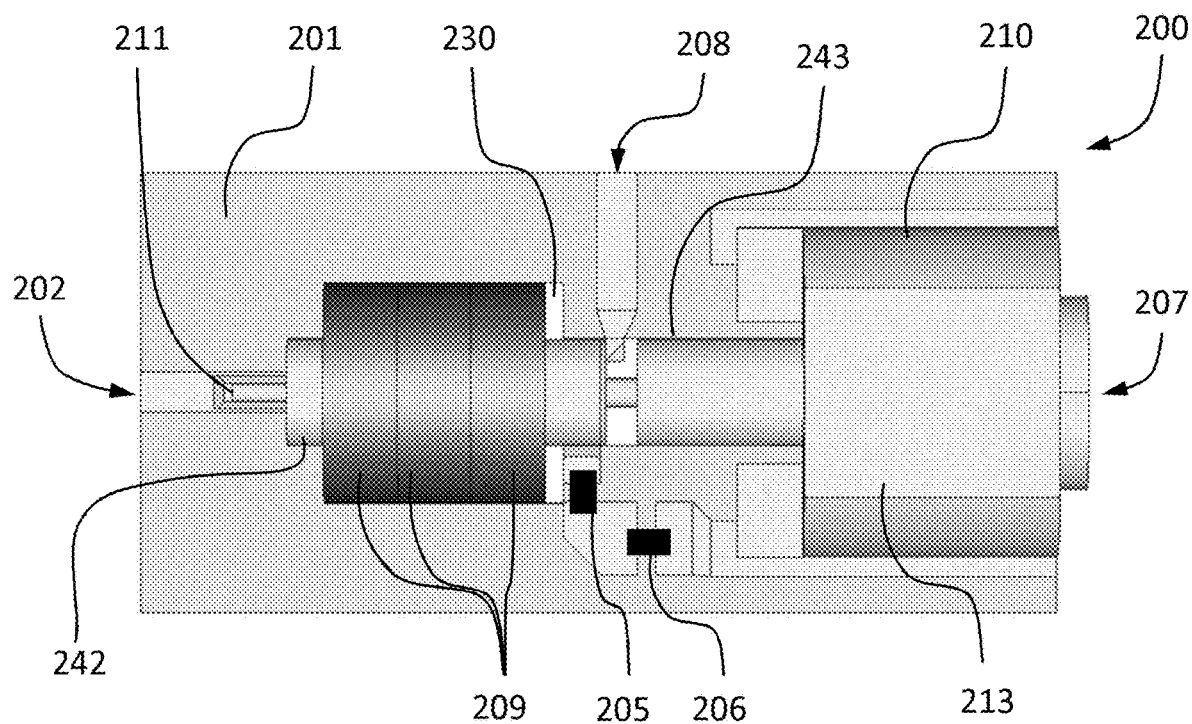
FIG. 6 shows a top view of a second exemplary embodiment of the inventive wideband-jack-ferrite-coupler.
Figure 7:
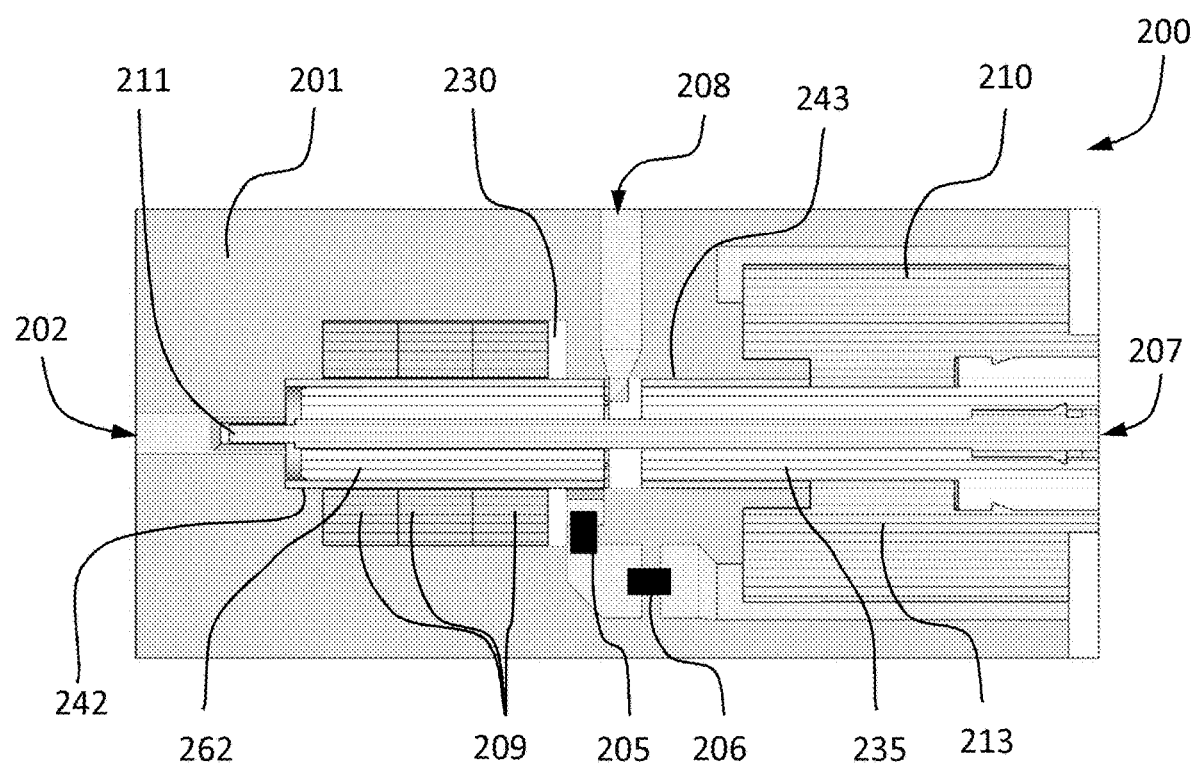
FIG. 7 shows a sectional top view of the second exemplary embodiment of the inventive wideband-jack-ferrite-coupler.

FIG. 6 and FIG. 7 shows the top view a second exemplary embodiment of the inventive wideband-jack-ferrite-coupler 200. For simplifying purposes FIG. 6 and FIG. 7 are discussed together. The functionality of the wideband-jack-ferrite-coupler 200 is basically the same as the wideband-jack-ferrite-coupler 100 described for the first exemplary embodiment. The exemplarily wideband-jack-ferrite-coupler 200 comprises a substrate 201, a connector 210, ferrite beads 209, resistors 205, 206 and a common ceramic substrate 230.

The substrate 201 carries all components of the exemplary wideband-jack-ferrite-coupler 200. The substrate 201 is preferably made of a suitable material having a small dissipation factor in RF applications. A suitable material is e.g. a glass filled PTFE, a high performance FR4 material or ROGER RO3003.

A wiring structure and the sum port 207 and/or two dividing ports 202, 208 are applied on the top side of the substrate 201. The ports 202, 208 arranged at the substrate 201 are guided to the edge of the substrate 201. The bottom side of the substrate 201 comprises a conductive layer which is connected to a reference signal plane.

The connector 210 in the exemplary wideband-jack-ferrite-coupler 200 is an edge mounted coaxial connector. The connector 210 has a shell which preferably is divided in a length direction to an isolated shell section 242 and a shell section connected to a body 243 of the connector 210. The shell of the connector connected to a body 243 also is connected to a reference-signal plane of the substrate 201. The reference-signal plane is connected to a reference potential of the signals. Preferably, the reference-signal plane has a ground potential. The body 213 of the connector 210 and the shell connected to the body 243 of the connector 210 are also fixed to a reference-signal plane of the substrate 201.

A common ceramic substrate 230 is arranged at the isolated section of the shell 242. The divided section of the shell is in between the isolated section of the shell 242 and section of the shell connected to the body of the connector 243. The common ceramic substrate 230 is penetrated by the central conductor 211. Preferably at least two resistors are integrated on the common ceramic substrate 230. The resistors 205, 206 are placed on the top side of the substrate 201.

Preferably, the resistors 205, 206 in combination with the at least two resistors of the common ceramic substrate 230 are configured as a Wheatstone-bridge. The resistors placed on the common ceramic substrate 230 form a first branch of a Wheatstone-bridge. The second branch of the Wheatstone-bridge is formed by a third resistor 205 and a fourth resistor 206 in series configuration in combination with the impedance of a device connected to the sum port 207. The first connection of the third resistor 205 is connected to the reference signal plane. The second connection of the third resistor 205 is connected to a first connection of the fourth resistor 206 and the isolate section of the shell 242 of the connector 210.

A first dielectric element 262 is applied between the central conductor 211 and the isolated section of the shell 242. A second dielectric element 235 separates the central conductor from the shell connected to the body of the connector 243. The dimensions of the dielectric elements are selected such that the resulting coaxial structure has a desired line-impedance of for example 50Ω.

The ferrite-beads 209 are placed on the isolated section of the shell 242. This construction forms a balun for transforming the asymmetrical signal of the dividing port 202 into a symmetrical signal usable for the bridge.

FIG. 7 shows the perspective view of the second exemplary embodiment of the inventive wideband-jack-ferrite-coupler 200. The perspective view shows the integration of the connector 210 into the substrate 201 comprising the ferrite-beads 209 and the common ceramic substrate 230. This connector assembly is placed in a recess area of the substrate 201.

Figure 8:
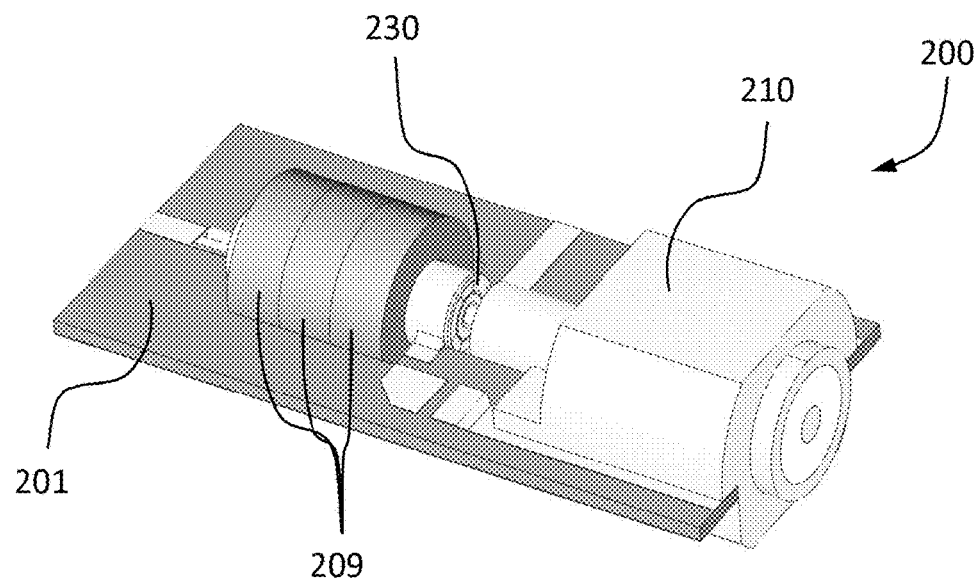
FIG. 8 shows a perspective view of the second exemplary embodiment of the inventive wideband-jack-ferrite-coupler.

FIG. 8 shows a side view of the wideband-jack-ferrite-coupler 200. Here it can be seen in more detail that the connector 210 including the ferrite-beads 209 on the isolated section of the connector's shell 242 is penetrating the substrate 201. The central conductor 211 is connected to the dividing port 202 on the substrate 201 at the top side in a flat manner. The flat connection of the central conductor 211 reduces the reflection on the connection point. Advantageously, the bandwidth of the coupler is increased.

Figure 9:
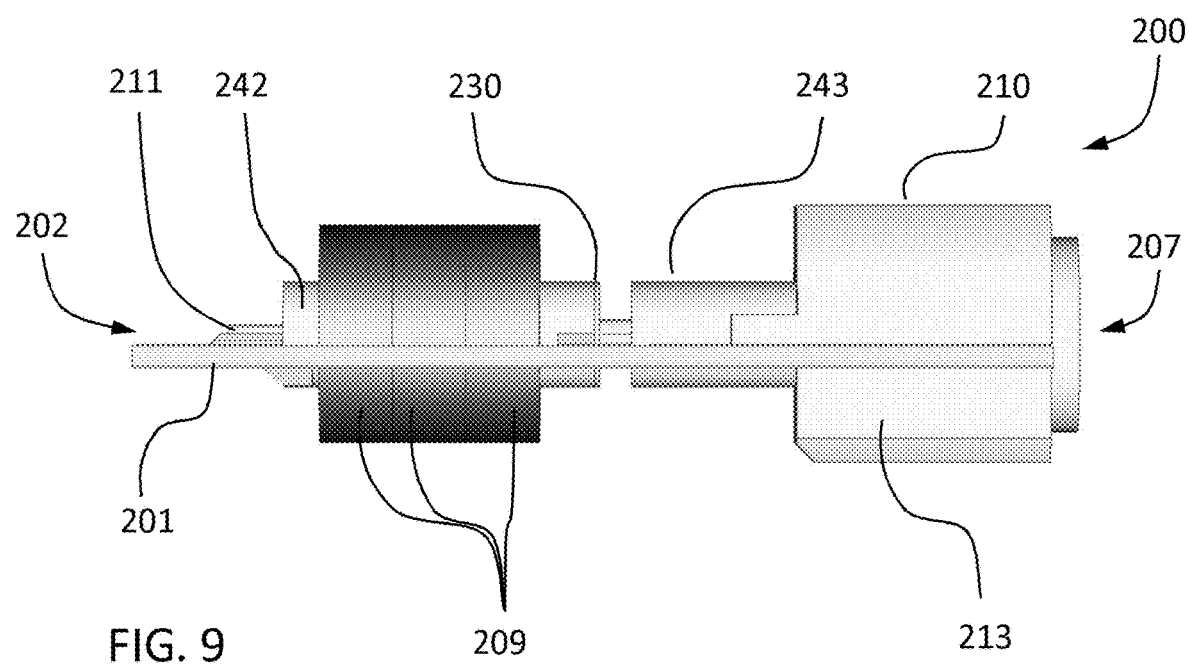
FIG. 9 shows side view the second exemplary embodiment of the inventive wideband-jack-ferrite-coupler.
Figure 10:
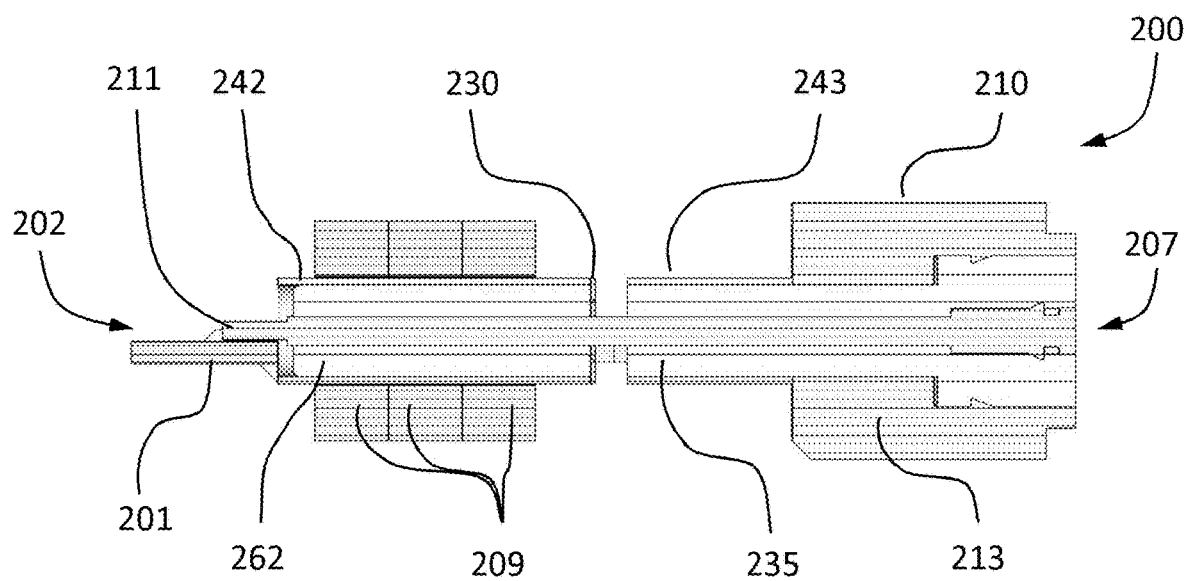
FIG. 10 shows a sectional side view of a the second exemplary embodiment of the inventive wideband-jack-ferrite-coupler.

FIG. 9 shows a side view and FIG. 10 shows are sectional side view of the wideband-jack-ferrite-coupler 200. Herein, it is more obvious how the connector 210 is integrated into the substrate 201. The central conductor 211 reaches from the sum port 207 to the dividing port 202. The shell is divided into an isolated section of the shell 242 and a section connected to the connector 243. A first portion of the dielectric material 214 is placed beneath the isolated section of the shell 262. A second portion of the dielectric material 235 is placed beneath the section of the shell connected to the body of the connector 243. The gap between the two portions of the dielectric material 262, 235 corresponds to the distance between the two shell portions of the connector 210. Beside the electrical separation of the shells 242, 243 the gap is intended to integrate the common ceramic substrate 230.

Figure 11:
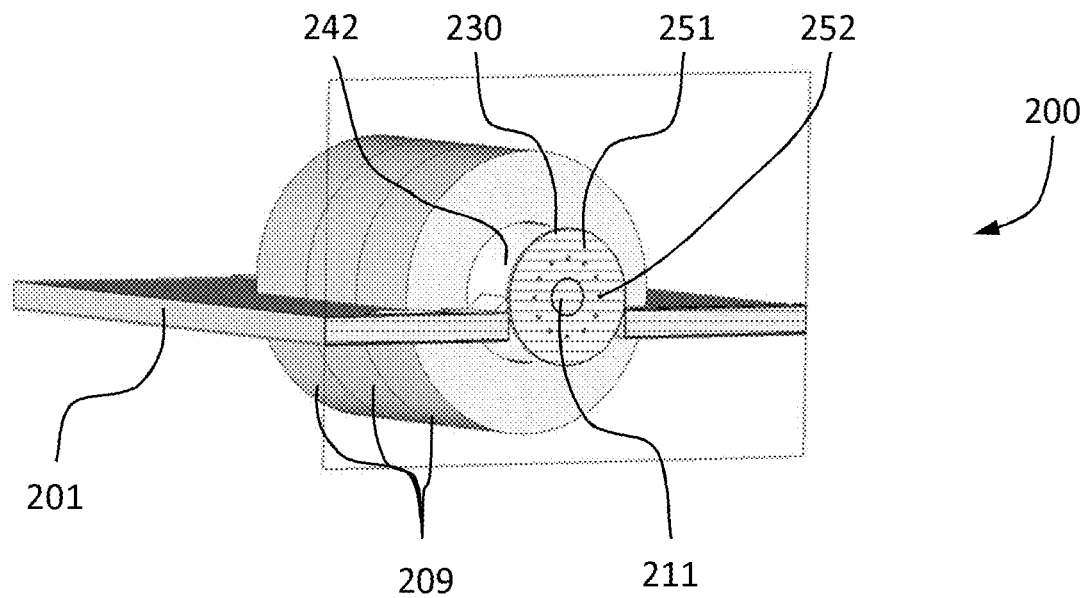
FIG. 11 shows a detailed sectional perspective view of a of a ceramic substrate.

FIG. 11 allows a closer look at the common ceramic substrate 230 and its application to the wideband-jack-ferrite-coupler 200. Therefore, FIG. 11 depicts a further sectional view of the wideband-jack-ferrite-coupler 200. In FIG. 11, the cutting plane is the bottom side of the common ceramic substrate 230. The bottom side of the common ceramic substrate 230 is plated with a conductive layer 251. This conductive layer 251 is made of cooper, gold plated cooper or silver plated cooper. The selection of materials is not restricted to the listed ones. The conductive layer is isolated from the shell 242 of the connector. The area in proximity to the central conductor 211 is also isolated. Additionally and preferably, the common ceramic substrate 230 comprises vias 252 for a connection of the bottom side conductive layer 251 with a top side conductor (not shown in FIG. 11). This construction allows a shielding of the resistive elements from the influence of the electromagnetic fields within the coaxial connector.

Figure 12:
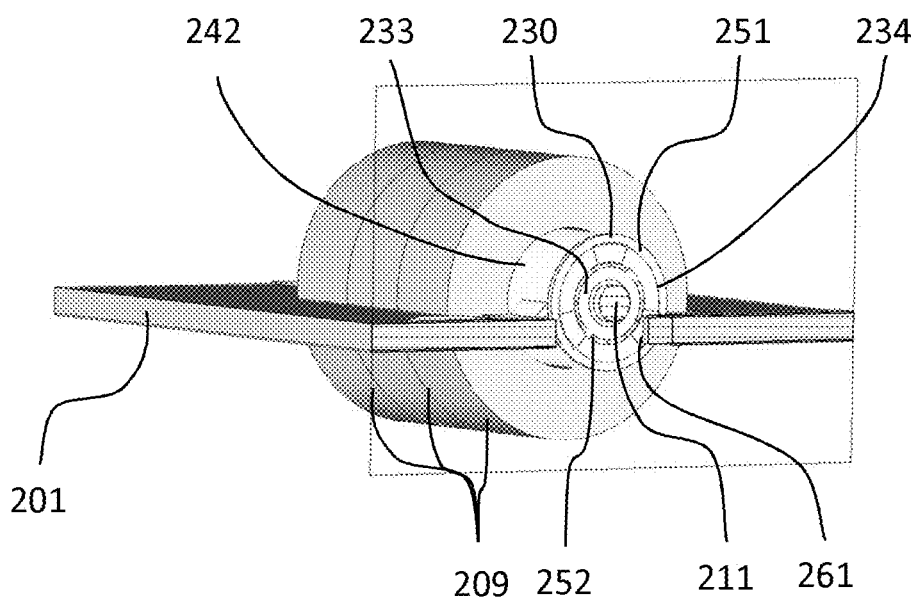
FIG. 12 shows a detailed sectional perspective view resistive elements on the ceramic substrate.

FIG. 12 shows a detailed sectional perspective view of the resistive elements on the common ceramic substrate 230.

Therefore, the cutting plane used in FIG. 11 is moved to the resistive elements 233 and 234 of the common ceramic substrate 230. The common ceramic substrate 230 comprises a first resistive element 233, a second resistive element 234, vias 252 and a wiring structure. The first resistive element 233 is arranged circularly with respect to the central conductor 211 of the connector as a ring. The inner diameter of the first resistive element 233 starts from the central conductor 211 and the outer diameter is in proximity to a wiring ring connecting the vias 252. The first resistive element is connected with its first terminal to the central conductor of the connector at its inner diameter. The second terminal of the first resistive 233 element is connected to the wiring ring connecting the vias 252. The second resistive element 234 is a segmented ring arranged circularly with respect to the central conductor 211 of the connector.

The second resistive element 234 starts with its inner diameter from the wiring ring connecting the vias 252 and ends in a proximity to the outer diameter of the common ceramic substrate 230. The second resistive element 234 is connected with a first terminal to the wiring ring connecting the vias 252. The second terminal of the second resistive element is the outer diameter of the resistive element 234 and is connected with the isolated part of the shell. The ring connecting the vias 252 is connected to land-patterns 261. These land-patterns 261 are placed within the isolated parts of the segmented second resistive element 234. In connection for the central point the voltage divider comprising the first resistive element 233 and the second resistive element 234 is made contactable to the substrate 201 with these land-patterns 261.

These resistive elements 233, 234 preferably consist of a thin-film resistive element. Such a thin-film resistive element 233, 234 is applied by a sputtering process followed by laser trimming.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A coupler, in particular a resistive coupler,
wherein a sum port and/or at least two dividing ports are arranged on a substrate,
wherein all ports are at least partially arranged at or in a connector,
wherein resistors, which are adapted to sum and/or divide an incoming and/or outgoing signal, are arranged at or in the connector,
wherein the connector comprises a central conductor,
wherein the central conductor is connected to the at least one dividing port in a flat manner,
wherein the connector is a coaxial connector comprising a shell and a dielectric material configured to separate the shell from the central conductor, wherein the shell of the connector is fixed to a reference-signal plane of the substrate, and/or
wherein a body of the connector and the shell connected to the body of the connector are fixed to a reference-signal plane of the substrate.

2. The coupler according to claim 1,
wherein the resistors are ceramic resistors and/or
wherein at least two resistors comprise a common ceramic substrate.

3. The coupler according to claim 2,
wherein the common ceramic substrate is arranged within a divided section of the shell.

4. The coupler according to claim 2,
wherein the common ceramic substrate is penetrated by the central conductor of the connector.

5. The coupler according to claim 1,
wherein at least one of the resistors comprises a thin-film resistive element.

6. The coupler according to claim 1,
wherein the shell is divided in a length direction to an isolated shell section and a shell section connected to a body of the connector whereby performing a divided section.

7. The coupler according to claim 1,
wherein at least one part of the shell is connected to ground and another part of the shell is connected to the substrate.

8. The coupler according to claim 1,
wherein the central conductor is connected to one of the dividing ports on the substrate.

9. The coupler according to claim 1,
wherein at least one of the resistive elements are arranged circularly with respect to the central conductor of the connector and/or
wherein at least one of the resistive elements is formed as at least one segment of a circle with respect to the central conductor.

10. The coupler according to claim 1,
wherein the connector is placed in a recess area of the substrate.

11. The coupler according to claim 1, wherein at least one ferrite-bead is arranged on or around the connector.

12. The coupler according to claim 11,
wherein the substrate comprises a recess area configured to receive at least one of the ferrite-beads and/or
wherein the connector comprises a circular slot adapted to integrate at least one of the ferrite-beads.

13. The coupler according to claim 11,
wherein the at least one ferrite-beads is penetrated by the central conductor of the connector and by the shell conductor of the connector.

\* \* \* \* \*